United States Patent
Tang et al.

(10) Patent No.: US 9,804,705 B2
(45) Date of Patent: Oct. 31, 2017

(54) FLEXIBLE PRINTED CIRCUIT BOARD, METHOD FOR MANUFACTURING THE SAME, AND CAPACITIVE TOUCH DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Xiuzhu Tang, Beijing (CN); Bin Ji, Beijing (CN)

(73) Assignees: BOE TECHNOLOGY GROUP CO., LTD. (CN); CHENGDU BOE OPTOELECTRONICS TECHNOLOGY CO., LTD. (CN)

(*) Notice: Subject to any disclaimer, the term of this patent is extended or adjusted under 35 U.S.C. 154(b) by 176 days.

(21) Appl. No.: 14/435,920

(22) PCT Filed: Aug. 29, 2014

(86) PCT No.: PCT/CN2014/085592
§ 371 (c)(1),
(2) Date: Apr. 15, 2015

(87) PCT Pub. No.: WO2015/192477
PCT Pub. Date: Dec. 23, 2015

(65) Prior Publication Data
US 2016/0246445 A1    Aug. 25, 2016

(30) Foreign Application Priority Data

Jun. 17, 2014  (CN) .......................... 2014 1 0271229

(51) Int. Cl.
*G06F 3/044* (2006.01)
*G06F 3/041* (2006.01)
(Continued)

(52) U.S. Cl.
CPC ............ *G06F 3/0418* (2013.01); *G06F 3/044* (2013.01); *G06F 3/0412* (2013.01); *H05K 1/025* (2013.01);
(Continued)

(58) Field of Classification Search
CPC ...... G06F 3/0412; G06F 3/0418; G06F 3/044; G06F 2203/04103; G06F 2203/04107;
(Continued)

(56) References Cited

U.S. PATENT DOCUMENTS 8,242,374 B2 * 8/2012 Chuo .................... H05K 1/118
174/250

(Continued)

FOREIGN PATENT DOCUMENTS

| CN | 101140368 A | 3/2008 |
| CN | 102830885 A | 12/2012 |
| KR | 10 2010 0038590 A | 4/2010 |

OTHER PUBLICATIONS

Office Action in Chinese Patent Application No. 201410271229.9, dated Oct. 8, 2016.
International Search Report and Written Opinion in PCT International Application No. PCT/CN2014/085592, dated Jan. 6, 2015.

*Primary Examiner* — Bryan Earles
(74) *Attorney, Agent, or Firm* — Brooks Kushman P.C.

(57) ABSTRACT

The present disclosure provides a flexible printed circuit board (FPCB), a method for manufacturing the FPCB, and a capacitive touch display device with the FPCB. The FPCB comprises an FPCB substrate and a common electrode voltage (VCOM) filter circuit arranged on the FPCB substrate. The FPCB further includes one or more filter units. the filter units comprises: a conduction layer, arranged on the FPCB substrate and electrically connected to a VCOM output end of the VCOM filter circuit; an isolation layer, arranged on the conduction layer; and a shielding film, which is grounded, arranged on the isolation layer and arranged parallel with the conduction layer.

5 Claims, 2 Drawing Sheets

(51) Int. Cl.
*H05K 1/02* (2006.01)
*H05K 3/46* (2006.01)
*H05K 1/16* (2006.01)
(52) U.S. Cl.
CPC ......... *H05K 1/0219* (2013.01); *H05K 1/0259* (2013.01); *H05K 1/0298* (2013.01); *H05K 3/4644* (2013.01); *G06F 2203/04103* (2013.01); *G06F 2203/04107* (2013.01); *H05K 1/162* (2013.01); *H05K 2201/05* (2013.01)
(58) Field of Classification Search
CPC .... H05K 1/0219; H05K 1/025; H05K 1/0259; H05K 1/0298; H05K 3/4644; H05K 1/162; H05K 2201/05
See application file for complete search history.

(56) References Cited

U.S. PATENT DOCUMENTS

| | | | |
|---|---|---|---|
| 2010/0044067 A1* | 2/2010 | Wong | H01B 7/0861 174/102 R |
| 2010/0236818 A1* | 9/2010 | Huang | H05K 1/0256 174/257 |
| 2011/0057893 A1* | 3/2011 | Kim | G06F 3/0412 345/173 |
| 2011/0242001 A1* | 10/2011 | Zhang | G06F 3/043 345/173 |
| 2012/0075218 A1 | 3/2012 | Lin et al. | |
| 2012/0326992 A1 | 12/2012 | Yeh | |
| 2014/0091815 A1 | 4/2014 | Suwald | |

* cited by examiner

FLEXIBLE PRINTED CIRCUIT BOARD, METHOD FOR MANUFACTURING THE SAME, AND CAPACITIVE TOUCH DISPLAY DEVICE

CROSS-REFERENCE TO RELATED APPLICATIONS

The present application is the U.S. National Phase of International Patent Application No. PCT/CN2014/085592, filed Aug. 29, 2014 and claims the priority of Chinese patent application No. 201410271229.9 filed on Jun. 17, 2014, the disclosure of which is incorporated herein by reference.

TECHNICAL FIELD

The present disclosure relates to the field of capacitive touch technology, and more particular to a flexible printed circuit board (FPCB), a method for manufacturing the FPCB, and a capacitive touch display device with the FPCB.

BACKGROUND

A low voltage alternating current electric field may be generated in a conductor layer by a long and narrow common electrode arranged a capacitive touch screen. Upon a finger touching the screen, a coupling capacitor may be generated between the finger and the conductor layer due to an electric field of the human body, an electrical current may flow from the common electrode around the capacitive touch screen to the touch point, and the size of the current is in proportion to a distance between the finger and the common electrode. The proportion and the size of the current are calculated by a controller arranged behind the capacitive touch screen, so as to accurately determine a position of the touch point.

However, the capacitive touch screen is prone to shift due to a noise interference, which may be caused by a variation of ambient temperature, ambient humidity, and ambient electric field, and lead to an inaccurate determination of the position of the touch point. A significant portion of the noise interference on the capacitive touch screen is caused by a noise of a common electrode voltage (VCOM). In the related art, it is provided a VCOM filter circuit in a flexible printed circuit board (FPCB) for filtering the VCOM from a driver integrated chip (IC), so as to process the noise of the VCOM for the capacitive touch screen. The VCOM filter circuit is provided to filter the VCOM inputted by the driver IC included in the capacitive touch display device, and the filtered VCOM is provided to the common electrode arranged around the capacitive touch screen and included in the capacitive touch display device via an output end of the VCOM. However, such implementation of filtering the noise of the VCOM is not satisfactory because there is a wide frequency range of the noise of the VCOM interfering on the capacitive touch screen.

SUMMARY

An object of the present disclosure is to provide a flexible printed circuit board (FPCB), a method for manufacturing the FPCB and a capacitive touch display device to reduce interference on a capacitive touch screen due to a noise of a VCOM.

For this object, the present disclosure provides in an embodiment a FPCB for a capacitive touch display device, including a FPCB substrate and a common electrode voltage (VCOM) filter circuit arranged on the FPCB substrate, wherein the FPCB further includes one or more filter units, and the filter units includes: a conduction layer, arranged on the FPCB substrate and electrically connected to a VCOM output end of the VCOM filter circuit; an isolation layer, arranged on the conduction layer; and a shielding film, which is grounded, arranged on the isolation layer and arranged parallel with the conduction layer.

Alternatively, the FPCB includes one layer of the FPCB substrate. An electrostatic discharging metal layer, which is grounded, is arranged on an area on the FPCB substrate where the conduction layer is not arranged, and the electrostatic discharging metal layer is insulated from the conduction layer.

Alternatively, the conduction layer is insulated from other circuits arranged on the FPCB substrate.

Alternatively, the FPCB includes a plurality of layers of the FPCB substrate arranged one on top of another. The VCOM filter circuit is arranged on at least one layer of the FPCB substrate; an electrostatic discharging metal layer, which is grounded, is arranged on an area on the at least one layer of the FPCB substrate where the conduction layer is not arranged, and the electrostatic discharging metal layer is insulated from the conduction layer.

Alternatively, when the conduction layer is arranged on each of at least two adjacent layers of the FPCB substrate, the conduction layer arranged on any one of the at least two adjacent layers of the FPCB substrate is not overlapped with the conduction layer arranged on any other one of the at least two adjacent layers of the FPCB substrate in a top-view direction.

Alternatively, when the conduction layer is arranged on a layer of the FPCB substrate, the conduction layer is insulated from the other circuits arranged on the layer of the FPCB substrate.

Alternatively, the filter units are sequentially arranged on the shielding film, and the insulation layer is arranged between two adjacent filter units on the FPCB substrate.

The present disclosure further provides in an embodiment a method for manufacturing the FPCB for the capacitive touch display device, the FPCB including a FPCB substrate and a common electrode voltage (VCOM) filter circuit, arranged on the FPCB substrate, the method including a step of arranging each of one or more filter units on the FPCB substrate; wherein the step of arranging each of one or more filter units on the FPCB substrate specifically includes:

arranging a conduction layer which is on the FPCB substrate and electrically connected to a VCOM output end of the VCOM filter circuit;

arranging an insulation layer on the conduction layer;

arranging on the isolation layer a shielding film which is grounded and arranged parallel with the conduction layer.

Alternatively, the method according to the embodiment of the present disclosure further includes: arranging an electrostatic discharging metal layer, which is grounded, on an area on the FPCB substrate where the conduction layer is not arranged, wherein the electrostatic discharging metal layer is insulated from the conduction layer.

Alternatively, when the FPCB includes a plurality of layers of the FPCB substrate arranged one on top of another, and the conduction layer is arranged on each of at least two adjacent layers of the FPCB substrate, the conduction layer arranged on any one of the at least two adjacent layers of the FPCB substrate is not overlapped with the conduction layer arranged on any other one of the at least two adjacent layers of the FPCB substrate in a top-view direction.

Alternatively, the method according to the embodiment of the present disclosure further includes: sequentially arranging the filter units on the shielding film, and arranging the insulation layer between two adjacent filter units on a layer of the FPCB substrate.

In an embodiment of the present disclosure, it is further provided a capacitive touch display device including the above FPCB.

In contrast to the related art, in the FPCB, the method for manufacturing the FPCB, and the capacitive touch display device with the FPCB according to the embodiments of the present disclosure, the filter unit is incorporated on the FPCB substrate on which the VCOM filter circuit is arranged, and the VCOM filter circuit receives the VCOM from the driver IC and makes an preliminary alternative current (AC) filter on the VCOM. The filter unit includes the conduction layer electrically connected to the VCOM output end of the VCOM filter circuit, the insulation layer arranged on the conduction layer, and the shielding film which is grounded, arranged on the isolation layer and arranged parallel with the conduction layer. The insulation layer is arranged between the conduction layer and the shielding film to keep space between the conduction layer and the shielding film, so as to generate a filter capacitor. Thus, the high frequency AC noise is discharged to the ground by the filter capacitor so as to further filter the VCOM in AC; while the shielding film may further shield the ambient noise. As a result, the noise interference on the touch screen is reduced and the shift of the signal is minimized.

DETAILED DESCRIPTION

Figure 1:
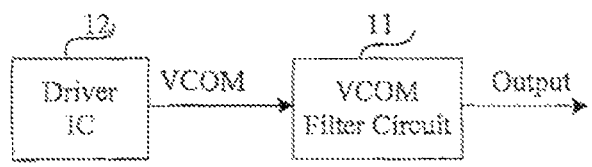
FIG. 1 illustrates an electrical connection of a VCOM filter circuit and a driver IC arranged on a flexible printed circuit board (FPCB) according to an embodiment of the present disclosure.

In an embodiment of the present disclosure, a flexible printed circuit board (FPCB) for a capacitive touch display device includes an FPCB substrate, a VCOM filter circuit and a filter unit. As illustrated in FIG. 1, the VCOM filter circuit 11 is arranged on the FPCB substrate, and filter the VCOM inputted by the driver IC 12 included in the capacitive touch display device, and provide the filtered VCOM to the common electrode arranged around the capacitive touch screen included in the capacitive touch display device by an output end of the VCOM.

Figure 2:
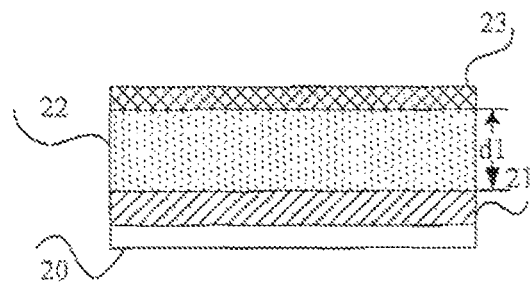
FIG. 2 is a sectional view of a filter unit included in an FPCB according to an embodiment of the present disclosure.
Figure 4:
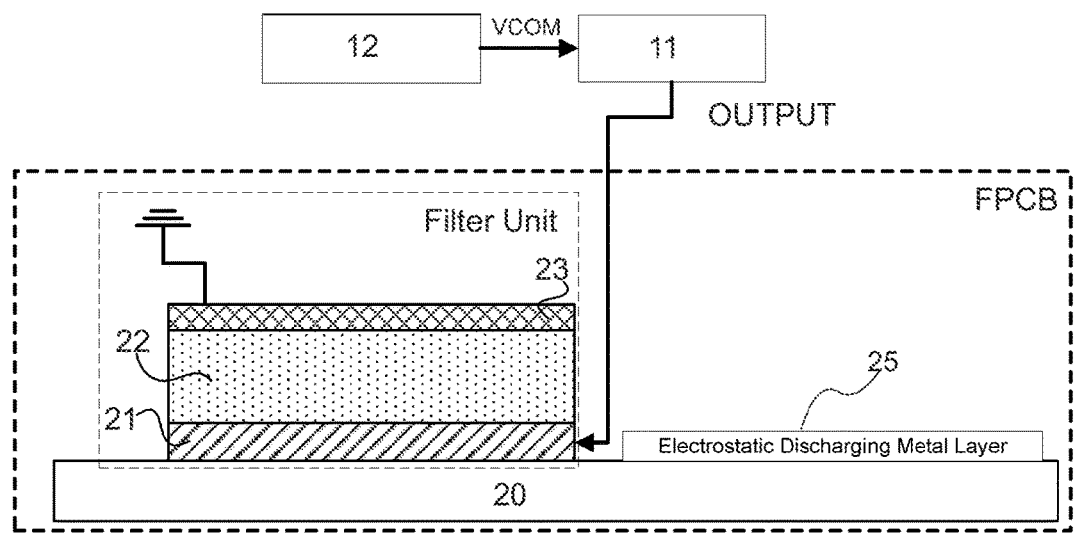
FIG. 4 illustrates a capacitive touch display device having an FPCB substrate with an electrostatic discharging metal layer.

As illustrated in FIG. 2, the filter unit includes:

a conduction layer 21, arranged on the FPCB substrate 20 and electrically connected to a VCOM output end of the VCOM filter circuit 11 (a position relationship of the conduction layer 21 and the FPCB substrate 20, and an electrical connection of the conduction layer 21 and the VCOM output are not shown in FIG. 4);

an isolation layer 22, arranged on the conduction layer 21; and a shielding film 23, which is grounded, arranged on the isolation layer 22 and arranged parallel with the conduction layer 21.

In particular, the VCOM filter circuit 11 includes a capacitor electrically connected between the VCOM output and the ground. Alternatively, the VCOM filter circuit 11 includes another circuit that may filter AC high frequency noise.

In the embodiment of the present disclosure, the filter unit is incorporated on the FPCB substrate on which the VCOM filter circuit is arranged, and the VCOM filter circuit receives the VCOM from the driver IC and makes a preliminary alternative current (AC) filter on the VCOM. The filter unit includes the conduction layer electrically connected to the VCOM output end of the VCOM filter circuit, the insulation layer arranged on the conduction layer, and the shielding film which is grounded, arranged on the isolation layer and arranged parallel with the conduction layer. The insulation layer is arranged between the conduction layer and the shielding film to keep space between the conduction layer and the shielding film, so as to generate a filter capacitor. Thus, the high frequency AC noise is discharged to the ground by the filter capacitor to function so as to further filter the VCOM in AC; while the shielding film may further shield the ambient noise. As a result, the noise interference on the touch screen is reduced and the shift of the signal is minimized.

In addition to the VCOM filter circuit and the filter unit, on the FPCB substrate it is further arranged other circuits such as a power supply circuit, a signal control circuit, a data transmission circuit, a voltage boost circuit, a backlight circuit, and the conduction layer included in the filter unit is insulated from the other circuits arranged on the FPCB substrate.

In particular, as illustrated in FIG. 2, given that d1 is the distance between the conduction layer 21 and the shielding film 23, s is the area of the conduction layer 21, $\in$ is a constant, and $\in r1$ is a dielectric constant between the conduction layer 21 and the shielding film 23, the equation for calculating the capacitance value C of the filter capacitor between the conduction layer 21 and the shielding film 23 is as follows:

$$C = \in \times \in r1 \times s/d1.$$

As a result, the area of the conduction layer 21 may be determined based on the desired size of the capacitance.

Alternatively as depicted in FIG. 4, in the FPCB according to an embodiment of the present disclosure, an electrostatic discharging metal layer 25, which is grounded, is arranged on an area on the FPCB substrate 20 where the conduction layer 21 is not arranged, and the electrostatic discharging metal layer is insulated from the conduction layer.

In the FPCB, an electrostatic discharging metal layer, which is grounded, is arranged on an area on the FPCB substrate where the conduction layer is not arranged, and the electrostatic discharging metal layer is insulated from the conduction layer. The electrostatic discharging metal layer may be made of any metal which is capable of electrostatic discharging; however, in practical implementation, the electrostatic discharging metal layer may be an electrolytic copper layer.

In practical implementation, the FPCB according to the embodiment of the present disclosure may be in a single layer, i.e. includes only one layer of the FPCB substrate. The electrostatic discharging metal layer, which is grounded, is arranged on an area on the FPCB substrate where the conduction layer is not arranged, and the electrostatic discharging metal layer is insulated from the conduction layer.

Alternatively, the FPCB according to the embodiment of the present disclosure may be in multi-layers, i.e. includes a plurality of layers of the FPCB substrate which are arranged one on top of another. The filter capacitor is generated between the conduction layer arranged on a layer of the FPCB substrate and the electrostatic discharging metal layer which is grounded and arranged on another layer of the FPCB substrate adjacent to the layer of the FPCB substrate, so as to further filter the VCOM in AC.

Alternatively, when the FPCB includes a plurality of layers of the FPCB substrate which are arranged one on top of another, and the conduction layer is arranged on each of at least two adjacent layers of the FPCB substrate, the conduction layer arranged on any one of the at least two adjacent layers of the FPCB substrate is not overlapped with the conduction layer arranged on any other one of the at least two adjacent layers of the FPCB substrate in a top-view direction. As a result, the filter capacitor is assured to be generated between the conduction layer and the electrostatic discharging metal layer which is grounded and arranged on the adjacent layer of the FPCB substrate, so that the filtering in AC is improved.

Alternatively, in the FPCB according to an embodiment of the present disclosure, the filter units are sequentially arranged on the shielding film, and the insulation layer is arranged between two adjacent filter units on the FPCB substrate. Since the area of the FPCB substrate is limited, the filter units are further incorporated on the shielding film to implement the parallel filter units. Thus, the value of the capacitor may be increased and the desired filtering result is obtained.

Figure 3:
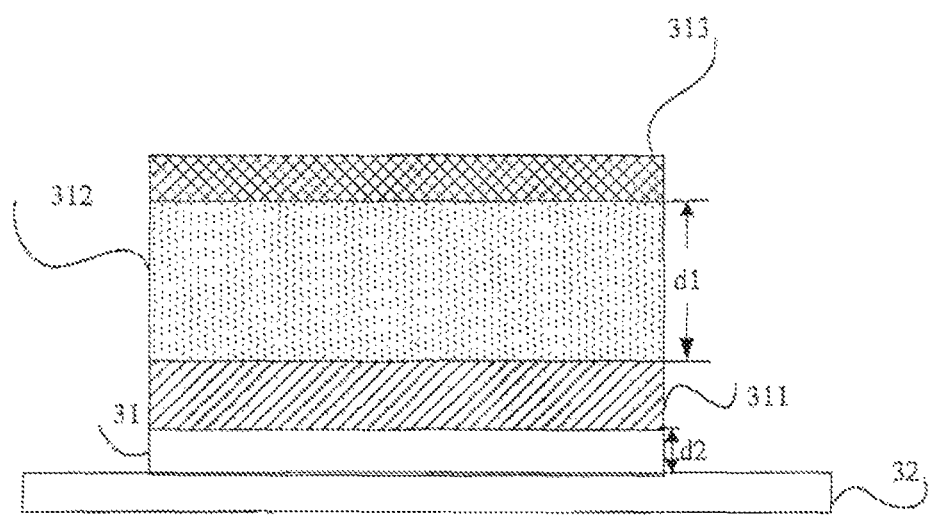
FIG. 3 is a sectional view of a double-layer FPCB according to an embodiment of the present disclosure.

In an embodiment of the present disclosure, as illustrated in FIG. 3, the FPCB includes a upper layer 31 of the FPCB substrate and a lower layer 32 of the FPCB substrate arranged one on top of another, wherein a conduction layer 311 is arranged on the upper layer 31 of the FPCB substrate, an insulation layer 312 is arranged on the conduction layer 311, and a shielding film 313, which is grounded, is arranged on the insulation layer 312.

An electrolytic copper layer, which is grounded, is arranged on an area on the upper layer 31 of the FPCB substrate where the conduction layer 311 is not arranged, and the electrolytic copper layer is insulated from the conduction layer 311. The layer of electrolytic copper is further arranged on the surface of the lower layer 32 of the FPCB substrate. Filter capacitors is generated both between the conduction layer 311 and the shielding film 313, and between the conduction layer 311 and the lower layer 32 of the FPCB substrate.

It is given that d1 is the distance between the conduction layer 311 and the shielding film 313, s is the area of the conduction layer 311, $\in$ is a constant, and $\in r1$ is a dielectric constant between the conduction layer 311 and the shielding film 313.

It is further given that d2 is the distance between the conduction layer 311 and the lower layer 32 of the FPCB substrate on which the layer of electrolytic copper is arranged, and $\in r2$ is a dielectric constant between the conduction layer 311 and the lower layer 32 of the FPCB substrate.

Thus, the equation for calculating the sum C' of the value of the filter capacitor between the conduction layer 311 and the shielding film 313 and the value of the filter capacitor between the conduction 311 and the lower layer 32 of the FPCB substrate is as follows:

$$C'=\in \times \in r1 \times s/d1 + \in \times \in r2 \times s/d2.$$

In the capacitive touch screen, the largest noise on an on-cell touch screen with a single layer is caused by the VCOM. As a result, the FPCB according to the embodiment of the present disclosure is particularly applicable to the on-cell touch display device with the single layer.

The present disclosure further provides in an embodiment a method for manufacturing a flexible printed circuit board (FPCB) for a capacitive touch display device. The FPCB includes a FPCB substrate and a common electrode voltage (VCOM) filter circuit. The VCOM filter circuit is arranged on the FPCB substrate. The method includes a step of arranging one or more filter units on the FPCB substrate.

The step of arranging one or more filter units on the FPCB substrate specifically includes:

arranging on the FPCB substrate a conduction layer which is electrically connected to a VCOM output end of the VCOM filter circuit;

arranging an insulation layer on the conduction layer; and arranging on the isolation layer a shielding film which is grounded and arranged parallel with the conduction layer.

In the method according to the embodiment of the present disclosure, the filter unit is incorporated on the FPCB substrate on which the VCOM filter circuit is arranged, and the VCOM filter circuit receives the VCOM from the driver IC and preliminarily filters the VCOM in AC. The filter unit includes the conduction layer electrically connected to the VCOM output end of the VCOM filter circuit, the insulation layer arranged on the conduction layer, and the shielding film which is grounded, arranged on the isolation layer and arranged parallel with the conduction layer. The insulation layer is arranged between the conduction layer and the shielding film to keep space between the conduction layer and the shielding film, so as to generate a filter capacitor between the conduction layer and the shielding film. Thus, the high frequency AC noise is discharged to the ground by the filter capacitor so as to filter the VCOM in AC; while the shielding film may further shield the ambient noise. As a result, the noise interference on the touch screen is reduced and the shift of the signal is minimized.

Alternatively, the method according to an embodiment of the present disclosure further includes:

arranging an electrostatic discharging metal layer, which is grounded, on an area on the FPCB substrate where the conduction layer is not arranged, wherein the electrostatic discharging metal layer is insulated from the conduction layer.

Alternatively, when the FPCB includes a plurality of layers of the FPCB substrate which are arranged one on top of another and the conduction layer is arranged on each of at least two adjacent layers of the FPCB substrate, the conduction layer arranged on any one of the at least two adjacent layers of the FPCB substrate is not overlapped with the conduction layer arranged on any other one of the at least two adjacent layers of the FPCB substrate in a top-view direction.

Alternatively, the method according to an embodiment of the present disclosure further includes:

arranging sequentially the filter units on the shielding film, and arranging the insulation layer between two adjacent filter units on a layer of the FPCB substrate.

In an embodiment of the present disclosure, there further provides a capacitive touch display device, including the above FPCB.

The optional embodiments of the present disclosure have been discussed. It is appreciated that many modifications and polishes may be made to the present disclosure without departing from the principle of the present disclosure for those skilled in the art. These modifications and polishes should also fall within the scope of the present disclosure.

What is claimed is:

1. A flexible printed circuit board (FPCB) for a capacitive touch display device, comprising an FPCB substrate and a common electrode voltage (VCOM) filter circuit arranged on the FPCB substrate, wherein
the FPCB further comprises one or more filter units, and the filter unit comprises:
a conduction layer, arranged on the FPCB substrate and electrically connected to a VCOM output end of the VCOM filter circuit;
an isolation layer, arranged on the conduction layer; and
a shielding film, which is grounded, arranged on the isolation layer, and arranged parallel with the conduction layer,
wherein the FPCB comprises a plurality of layers of the FPCB substrate arranged one on top of another, the VCOM filter circuit is arranged on at least one layer of the FPCB substrate; an electrostatic discharging metal layer, which is grounded, is arranged on the at least one layer of the FPCB substrate where the conduction layer is not arranged, and the electrostatic discharging metal layer is insulated from the conduction layer, and
the conduction layer is arranged on each of at least two adjacent layers of the plurality of layers of the FPCB substrate, the conduction layer arranged on any one of the at least two adjacent layers of the FPCB substrate is not overlapped with the conduction layer arranged on any other one of the at least two adjacent layers of the FPCB substrate in a top-view direction.

2. The FPCB according to claim 1, wherein the FPCB comprises one layer of the FPCB substrate, and
an electrostatic discharging metal layer, which is grounded, is arranged on an area on the FPCB substrate where the conduction layer is not arranged, and the electrostatic discharging metal layer is insulated from the conduction layer.

3. The FPCB according to claim 2, wherein
the conduction layer is insulated from other circuits arranged on the FPCB substrate.

4. A method for manufacturing a flexible printed circuit board (FPCB) for a capacitive touch display device, the FPCB comprising a FPCB substrate and a common electrode voltage (VCOM) filter circuit arranged on the FPCB substrate, the method comprising a step of arranging one or more filter units on the FPCB substrate,
wherein the step of arranging one or more filter units on the FPCB substrate comprises:
arranging on the FPCB substrate a conduction layer which is electrically connected to a VCOM output end of the VCOM filter circuit;
arranging an insulation layer on the conduction layer;
arranging on the insulation layer a shielding film which is grounded and arranged parallel with the conduction layer, and
arranging an electrostatic discharging metal layer, which is grounded, on an area on the FPCB substrate where the conduction layer is not arranged, wherein the electrostatic discharging metal layer is insulated from the conduction layer,
the FPCB comprises a plurality of layers of the FPCB substrate arranged one on top of another and the conduction layer is arranged on each of at least two adjacent layer of the FPCB substrate, the conduction layer arranged on any one of the at least two adjacent layers of the FPCB substrate is not overlapped with the conduction layer arranged on any other one of the at least two adjacent layers of the FPCB substrate in a top-view direction.

5. A capacitive touch display device, comprising the FPCB according to claim 1.

* * * * *